US011651830B2

(12) United States Patent
Santhanam

(10) Patent No.: US 11,651,830 B2
(45) Date of Patent: May 16, 2023

(54) LOW LATENCY DECODER FOR ERROR CORRECTING CODES

(71) Applicant: Synopsys, Inc., Mountain View, CA (US)

(72) Inventor: Venugopal Santhanam, Bengaluru (IN)

(73) Assignee: Synopsys, Inc., Sunnyvale, CA (US)

( * ) Notice: Subject to any disclaimer, the term of this patent is extended or adjusted under 35 U.S.C. 154(b) by 99 days.

(21) Appl. No.: 17/337,979

(22) Filed: Jun. 3, 2021

(65) Prior Publication Data
US 2022/0013187 A1 Jan. 13, 2022

Related U.S. Application Data

(60) Provisional application No. 63/049,814, filed on Jul. 9, 2020.

(51) Int. Cl.
| | | |
|---|---|---|
| *G11C 16/04* | (2006.01) |
| *G11C 29/14* | (2006.01) |
| *G11C 29/42* | (2006.01) |
| *G11C 29/36* | (2006.01) |
| *G11C 29/44* | (2006.01) |

(52) U.S. Cl.
CPC ............. *G11C 29/14* (2013.01); *G11C 29/36* (2013.01); *G11C 29/42* (2013.01); *G11C 29/44* (2013.01); *G11C 2029/3602* (2013.01)

(58) Field of Classification Search
CPC ......... G11C 29/14; G11C 29/36; G11C 29/42; G11C 29/44; G11C 2029/3602
See application file for complete search history.

(56) References Cited

U.S. PATENT DOCUMENTS

| | | | | |
|---|---|---|---|---|
| 7,206,993 B2* | 4/2007 | Senda | ............... | H03M 13/1585 714/784 |
| 8,386,894 B2* | 2/2013 | Latremouille | ........ | H04L 1/0052 714/752 |
| 2006/0031742 A1* | 2/2006 | Fukuoka | ........... | H03M 13/1535 714/784 |

* cited by examiner

*Primary Examiner* — Pho M Luu
(74) *Attorney, Agent, or Firm* — Patterson + Sheridan, LLP

(57) ABSTRACT

A method for error correction comprises receiving data at a first device, and decoding, by decoder circuitry of the first device, the data. Decoding the data comprises determining a first error location within the data, and determining a first error magnitude within the data in parallel with determining the first error location. Decoding the data further comprises performing error correction to generate the decoded data based on the first error location and the first error magnitude. The method further comprises transmitting the decoded data to a second device.

20 Claims, 7 Drawing Sheets

LOW LATENCY DECODER FOR ERROR CORRECTING CODES

RELATED APPLICATION

This application claims the benefit of U.S. provisional patent application Ser. No. 63/049,814, filed Jul. 9, 2020, which is hereby incorporated herein by reference.

TECHNICAL FIELD

The present disclosure relates to data decoding, and more particularly, to a low latency decoder for correcting errors in data.

BACKGROUND

When communicating between devices, data corruption may occur. For example, when communicating between memory devices and integrated circuit (IC) dies or between IC dies, data corruption may occur. In a specific example, in dynamic random access memory (DRAM) applications, data corruption may occur and may result in system failure if the error is not corrected and/or increased latency times as a result of data correction. The data corruption could be either due to random errors or chip failure.

In various embodiments, in order to detect and correct the errors due to random errors or chip failure, Forward Error Correction (FEC) mechanisms are used. An FEC mechanism adds additional check bits/parity bits in the communication between devices to correct the errors within the data. In some instances, the FEC scheme utilizes spare (error correcting code (ECC)) bits as parity bits and during a decoding process to correct the errors within the data.

In many instances, as the number of errors that can be corrected is increased, the latency of the decoder increases. The increased latency may exceed system parameters, limiting the number of errors that can be corrected.

SUMMARY

In one example, a method for error correction comprises receiving data at a first device, and decoding, by decoder circuitry of the first device, the data. Decoding the data comprises determining a first error location within the data, and determining a first error magnitude within the data in parallel with determining the first error location. Decoding the data further comprises performing error correction to generate the decoded data based on the first error location and the first error magnitude. The method further comprises transmitting the decoded data to a second device.

In another example, a communication interface system of a first device comprises decoder circuitry. The decoder circuitry is configured to receive data and generate decoded data from the data. The decoded data is generated from the data by determining a first error location within the data during a first period, and determining a first error magnitude within the data during a second period. The first period and the second period are at least partially overlapping. The decoded data is further generated by performing error correction to generate the decoded data based on the first error location and the first error magnitude. The decoder circuitry is further configured to transmit the decoded data to a host device.

In another example, a system comprises a first device. The first device is configured to receive data, and generate decoded data from the data. The decoded data is generated by determining a first error location within the data, and determining a first error magnitude within the data in parallel with determining the first error location. The decoded data is further generated by performing error correction to generate the decoded data based on the first error location and the first error magnitude. The first device is further configured to transmit the decoded data to a second device via an interface.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a low latency decoder for error correcting codes. In integrated circuit (IC) die to IC die communication links and IC die to memory device communication links, data correction may occur. The data corruption may be either due to random errors or due to device failure. Forward Error Correction (FEC) mechanisms are used to detect and correct the errors due to random errors or chip failure. The FEC mechanisms utilize spare (error correcting code (ECC)) bits as parity and during a decoding process to recover from errors.

One example FEC scheme is based on Reed-Solomon (RS) codes. RS codes are non-binary codes using a fixed number of consecutive bits which are interpreted as a symbol. In one example, the RS code utilizes parity symbols to correct errors within the data. An RS code may be represented as RS(n,k,q) consisting of q-bit symbols, and a code word consisting of 'n' symbols with 'k' message symbols. Further, the number of parity symbols is (n−k), and the number of symbols that can be corrected ((n−k)/2). In various instances, based on the amount of redundant bits available, two or four parity symbols can be used to correct one or two errors, respectively, in the data.

Correcting errors within the data adds latency to the decoding processing. Further, as the number of errors to be corrected is increased, the latency of the decoding process is increased. Increasing the latency of the decoding processes adds delay to the data transmission process. Accordingly, increased decoder delays negatively affect the overall system process and may cause failures within the corresponding system.

Certain aspects are directed to a low latency decoder. The low latency decoder corrects two or more symbols per clock cycle without introducing delay-based errors into the decoding process. In one example, the low latency decoder employs an RS decoding scheme to correct two or more symbols per clock cycle in various memory device to IC die and IC die to IC die communication systems. In contrast to other RS decoding schemes, the low latency decoder of this disclosure determines error locations and error magnitudes in parallel. Error locations refer to the positions in a given code word where data symbols are corrupted. Error magnitude refers to the error value which has been corrupted. Further, the error magnitude may refer to the data at the location specified by an error location. Accordingly, the low latency decoder of this disclosure is able to detect and correct errors in a code word (e.g., data) in less clock cycles than other methods. Further, certain aspects provide a low latency decoder that mitigates decoder delays, avoids (or at least reduces) data retransmissions, and/or system failures as compared to decoders that do not use parallel processing to determine error locations and error magnitudes.

Figure 1:
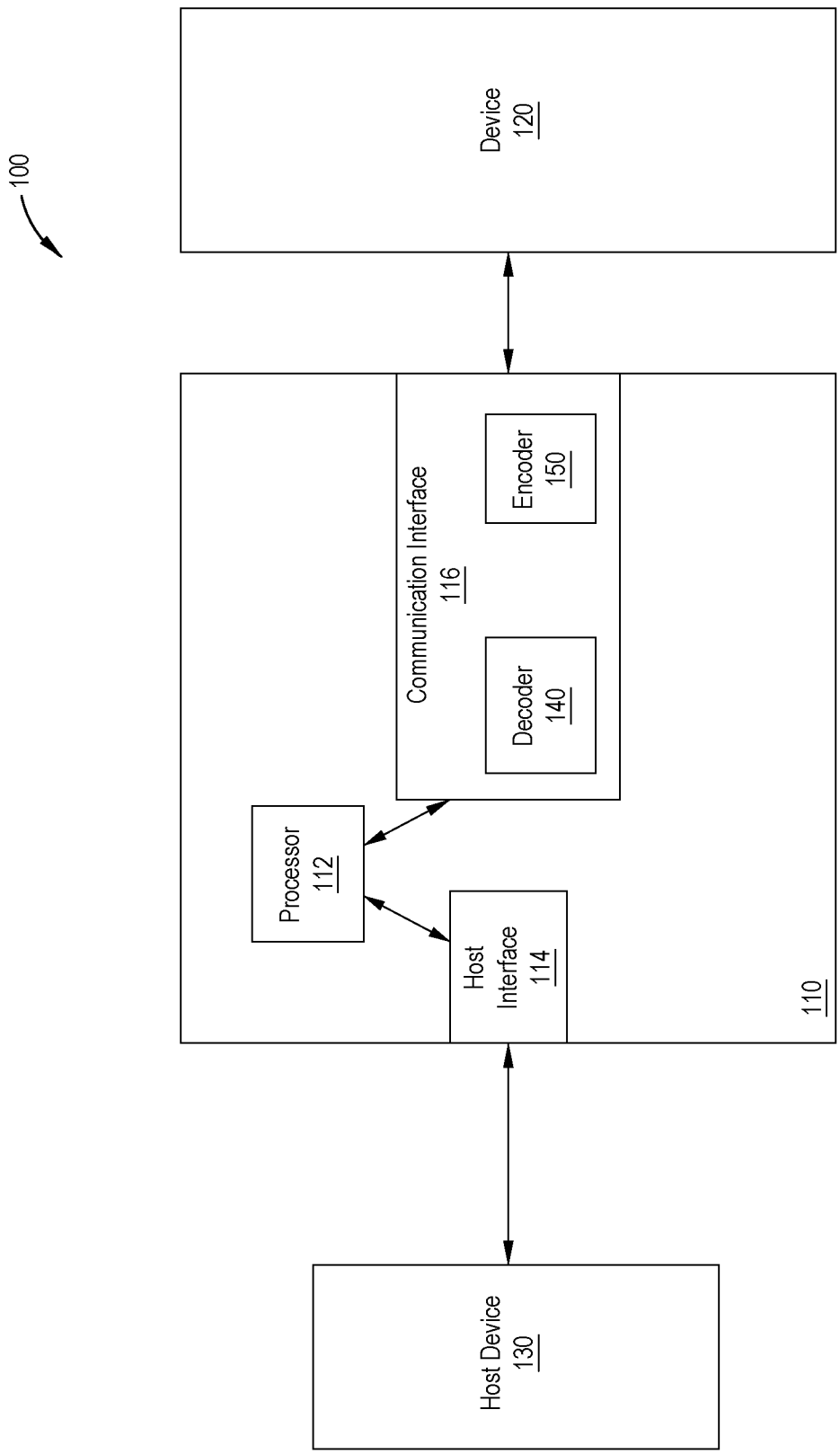
FIG. 1 illustrates a block schematic diagram of a computing system, according to one or more embodiments.

FIG. 1 illustrates a computing system 100 that includes a device 110 and a device 120. Further, the computing system 100 includes a host device 130. The device 110 and/or the device 120 is connected to the host device 130 through one or more interfaces.

The device 110 is an integrated circuit (IC) die. The device 110 includes one or more processors (e.g., controllers) and/or circuit elements that communicate with the host device 130 and the device 120. For example, the device 110 includes processor 112, host interface 114, and communication interface system 116. The processor 112 is communicably connected to the host interface 114 and the communication interface system 116. The processor 112 processes requests, responses, and other types of communication received from the host device 130 via the host interface 114. The processor 112 communicates the processed requests, responses, and/or other communications to the device 120 via the communication interface system 116. The communication interface system 116 communicates processed requests or responses to or from the device 120.

The communication interface system 116 includes a decoder 140 and an encoder 150. The decoder 140 decodes communications received from the device 120. Further, the encoder 150 encodes communications transmitted to the device 120. In one example, the encoder 150 and the decoder 140 employ an RS coding scheme. The decoder 140 includes one or more controllers and/or circuitry configured to decode and correct data received from the device 120. In such an example, the decoder 140 may be referred to as decoder circuitry. In one example, at least a portion of the decoder 140 is implemented as a set of instructions (e.g., the instructions 726 of the main memory 704 of FIG. 7) executed by a processing device (e.g., the processing device 702 of FIG. 7). The decoder 140 may be an RS decoder. In other embodiments, the decoder 140 may include other coding schemes. Additionally, or alternatively, the encoder 150 includes one or more controllers and/or circuitry configured to encode data to be sent to the device 120. In such example, the encoder 150 may be referred to as encoder circuitry. In one example, at least a portion of the encoder 150 is implemented as a set of instructions (e.g., the instructions 726 of the main memory 704 of FIG. 7) executed by a processing device (e.g., the processing device 702 of FIG. 7).

The device 120 is an IC die similar to that of the device 110. In such an example, the device 120 includes one or more processors, communication interfaces, and/or other circuit elements. In one example, the device 120 is a memory device. In such an example, the device 120 includes one or more memory blocks and controllers.

The devices 110 and 120 are mounted to one or more substrates. In an example where the device 110 and the device 120 are IC dies, the one or more substrates includes one or more communication paths that communicably connect the device 110 and the device 120. These communication pathways may be referred to as die to die communication links. Further, in an example where the device 110 is an IC die and the device 120 is a memory device, the one or more substrates includes one or more communication paths that connect the device 110 and the device 120. In such an example, the communication paths that may be referred to as die to memory communication links.

The host device 130 is a processing system that includes one or more processors and/or other circuit elements. The host device 130 includes one or more integrated circuit dies. The host device 130 may be mounted to the same substrate as the device 110 and the device 120, or may be mounted on a different substrate than the device 110 and the device 120.

The host device 130 includes one or more interfaces and/or processors that communicate with the device 110. In one example, the host device 130 communicates requests to the device 120 via the device 110. Further, the host devices 130 receives responses from the device 120 via the device 110. Further, one or more applications may be executed by the host device 130. In one example, the host device 130 is part of the computer system 700 of FIG. 7.

Figure 2:
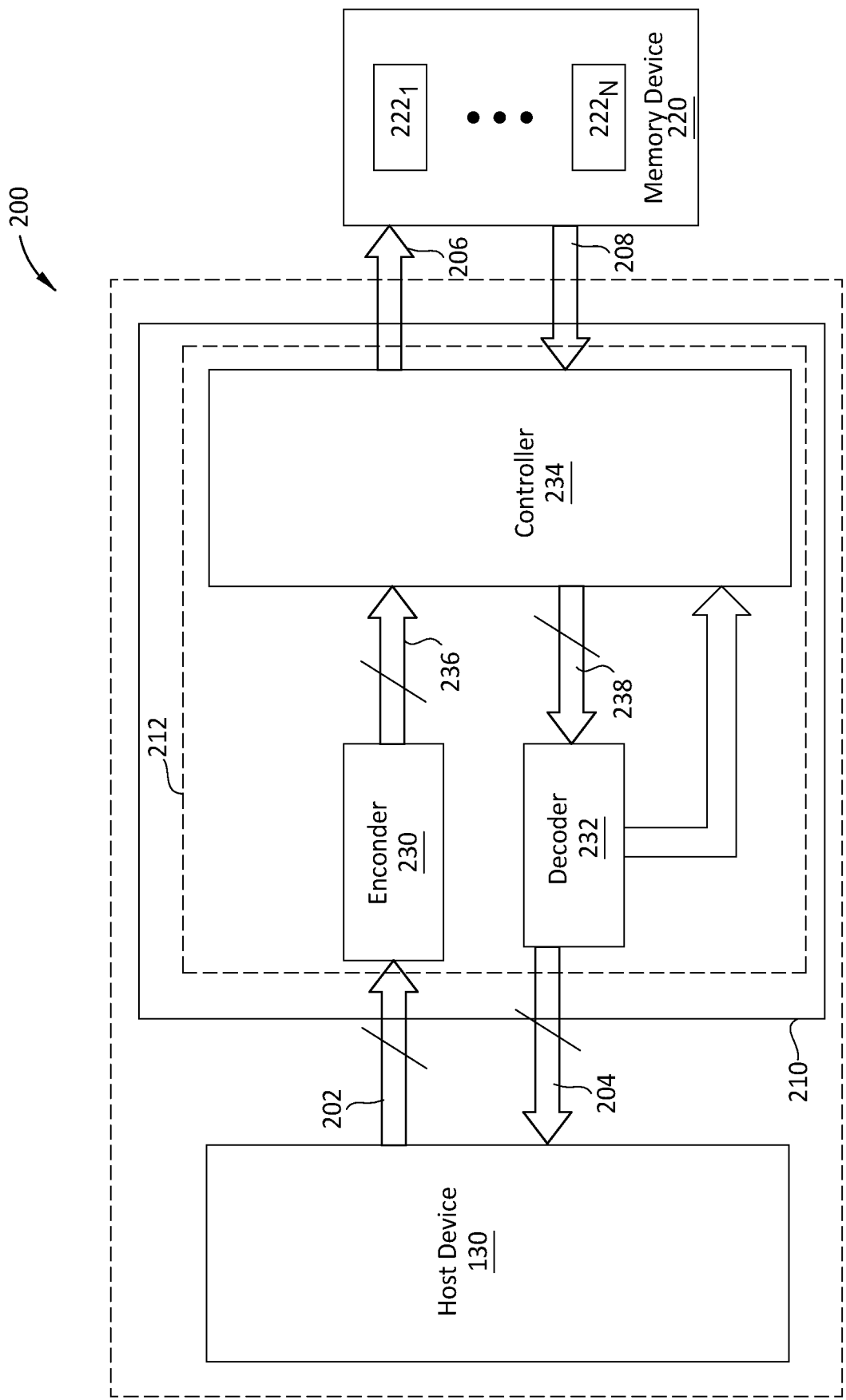
FIG. 2 illustrates a block schematic diagram of a computing system, according to one or more embodiments.

FIG. 2 illustrates a computing system 200, according to one or more examples. The computing system 200 includes the host device 130, the IC die 210, and the memory device 220. The IC die 210 is configured similar to that of the device 110 of FIG. 1 and the memory device 220 is configured similar to that of the device 120 of FIG. 1. For example, the IC die 210 is communicably connected to the host device 130 and the memory device 220. Further, the IC die 210 receives requests from the host device 130 via path 202. The path 202 may be a bus. For example, the path 202 is a bus of 32, 64, 128, 256 bit lines. In another example, the path 202 is a bus of greater than 256 bit lines. The IC die 210 communicates responses to the host device 130 via the path 204. The path 204 may be a bus. For example, the path 204 is a bus of 32, 64, 128, 256 bit lines. In another example, the path 204 is a bus of greater than 256 bit lines.

The IC die 210 is communicably connected to the memory device 220 via path 206 (e.g., a communication channel) and path 208 (e.g., another communication channel). The IC die 210 communicates requests (e.g., write requests) to the memory device 220 via the path 206. Further, the IC die 210 receives responses (e.g., response data) from the memory device 220 via the path 208. The responses may be in the form of one or more code words.

In some aspects, the IC die 210 includes communication interface 212. The communication interface 212 includes an encoder 230, a decoder 232, and a controller 234. The encoder 230 and the decoder 232 are communicably connected to the controller 234 and are configured similar to the decoder 140 and the encoder of 150 of FIG. 1, respectively. The encoder 230 is communicably connected to the controller 234 via path 236, and the decoder 232 is communicably connected to the controller 234 via the path 238. The paths 236 and 238 are buses. For example, the paths 236 and 238 are buses of 36, 72, 144, or 288 bit lines, or greater. In one example, the paths 236 and 238 are buses having a bit size greater than the paths 202 and 204. Further, the paths 236 and 238 may be buses having the same size.

The controller 234 may be referred to as a memory controller. The controller 234 controls the flow of data between the encoder 230 and decoder 232, and the memory device 220. The controller 234 may be a random-access memory (RAM) controller. In one example, the controller 234 is a dynamic random access memory (DRAM) controller. In other examples, the controller 234 is a controller for any other suitable type of memory.

The memory device 220 includes one or more memory banks $222_1$-$222_N$ (collectively referred to as memory banks 222) with N being an integer of two or more, and one/or more controllers. The memory banks 222 may have the same size (e.g., able to store the same number of bits). For example, each of the memory banks 222 may store 2, 4, or 8 bits. In another example, each of the memory banks 222 may store greater than 8 bits. The memory device 220 is a volatile or non-volatile memory. In one example, the memory device 220 is a RAM. For example, the memory device 220 is a double data rate (DDR) DRAM. In one example, the memory device 220 is a DDR4 DRAM or DDR5 DRAM. In other examples, the memory device 220 may be any other suitable type of RAM.

When communicating with the communication interface 212, each of the memory banks 222 provides M bits of data on a positive edge of a clock signal and M bits of data on a negative edge of the clock signal. M is an integer greater than zero. In one example, M is eight. The clock signal is provided by the IC die 210 or the memory device 220.

In one example, when communicating with the communication interface 212, one or more of the memory banks 222 may experience one or more faults (e.g., errors). Accordingly, the data (e.g., code words) provided by a corresponding one of the memory banks 222 is faulty (e.g., include one or more errors). Errors may occur when encoding the data and communicating the data from the encoder 230 to the memory banks 222. Additionally, or alternatively, errors may occur when accessing and communicating the data from the memory banks 222 to the decoder 232 for decoding.

In one example, the encoder 230 and decoder 232 employ a FEC scheme that uses parity data (e.g., parity symbols) to correct errors in the data provided by the memory banks 222. For example, the encoder 230 adds one or more parity symbols to the data received from the host device 130. The encoder 230 generates the one or more parity symbols and communicates the parity symbols with the received data to the memory device 220. The number of parity symbols is two or more. For example, the number of parity symbols may be 2, 4, 6, 8 or more. The parity symbols are stored within the memory device 220. For example, the parity symbols are stored in one or more of the memory banks 222 within the memory device 220.

The encoder 230 generates a number of predetermined parity symbols for each data segment (e.g., memory banks 222) that may be corrected. In one example, for each of the memory banks 222 that may be corrected, the encoder 230 generates two parity symbols. The encoder 230 generates the parity symbols based on data received from the host device 130. For example, the encoder 230 generates the parity symbols based on data received from the host device 130 and communicates the parity symbols with the data to the memory device 220. The parity symbols are stored in one or more of the memory banks 222. In one example, the encoder 230 receives 256 bits of data and generates 288 bits of data (e.g. including the received 256 bits of data and 32 parity bits).

In various aspects, the timing (e.g., frequency) associated with the encoder 230 and decoder 232 may be dependent on manufacturing properties and/or processing technology used to manufacture the circuit elements of the encoder 230. For example, for a 7 nm fin field-effect transistor (FinFET) processing technology having a slow corner (e.g., 125 degrees Celsius) target node, the encoder 230 achieves timing close to 1.4 GHz with latency of one clock cycle. Further, the decoder 232 achieves close to 1.4 GHz timing with a two clock cycle latency. Using an encoder having a latency of one clock cycle and a decoder having a latency of two clock cycles reduces retransmissions of data, and/or faults within the computing system 200.

In one example, a RS code is used to correct errors within data. The RS code is a non-binary code that is used to correct errors within the data. In other examples, other coding methods may be used to correct errors within the data. For example, binary or non-binary coding methods may be used to correct errors within the data.

In some aspects, parity symbols are communicated by the memory device 220 with corresponding data. The parity symbols are used by the decoder 232 to correct errors within the data. The received data includes x total symbols, n data symbols, and t parity symbols (e.g., (x, n, t)). During the data decoding process, the decoder 232 determines a number of errors, the magnitude of the errors, and the position of the errors within the data. Further, the decoder 232 corrects the identified errors within the data. In one example, the decoder 232 determines the magnitude of one or more errors and the position of the one or more errors within the data in parallel and independently from each other. Further, in one example, the decoder 232 detects and corrects for errors within the data within two clock cycles of a clock signal of the IC die 210. The decoder 232 further communicates the decoder status to the controller 234. The decoder status may indicate a number of errors detected within the data. Further, the decoder status may include an indication as to whether or not the decoder 232 was able to correct the identified errors within the data.

While the example of FIG. 2 illustrates an IC die 210 and memory device 220 and the correction of errors within data communicated from the memory device 220 to the IC die 210, the aspects described herein are applicable for correction of errors within data communicated between multiple IC dies. For example, instead of the data to be corrected being received from the memory device 220, the data may be received from another device similar to the device 120. Further, in such an example, similar methods for correcting data received from the other device may be used. Further, multiple IC dies or memory devices may be connected to the IC die 210. Similar methods may be used to correct data received from one or more memory devices 220 and/or one or more IC dies.

Figure 3:
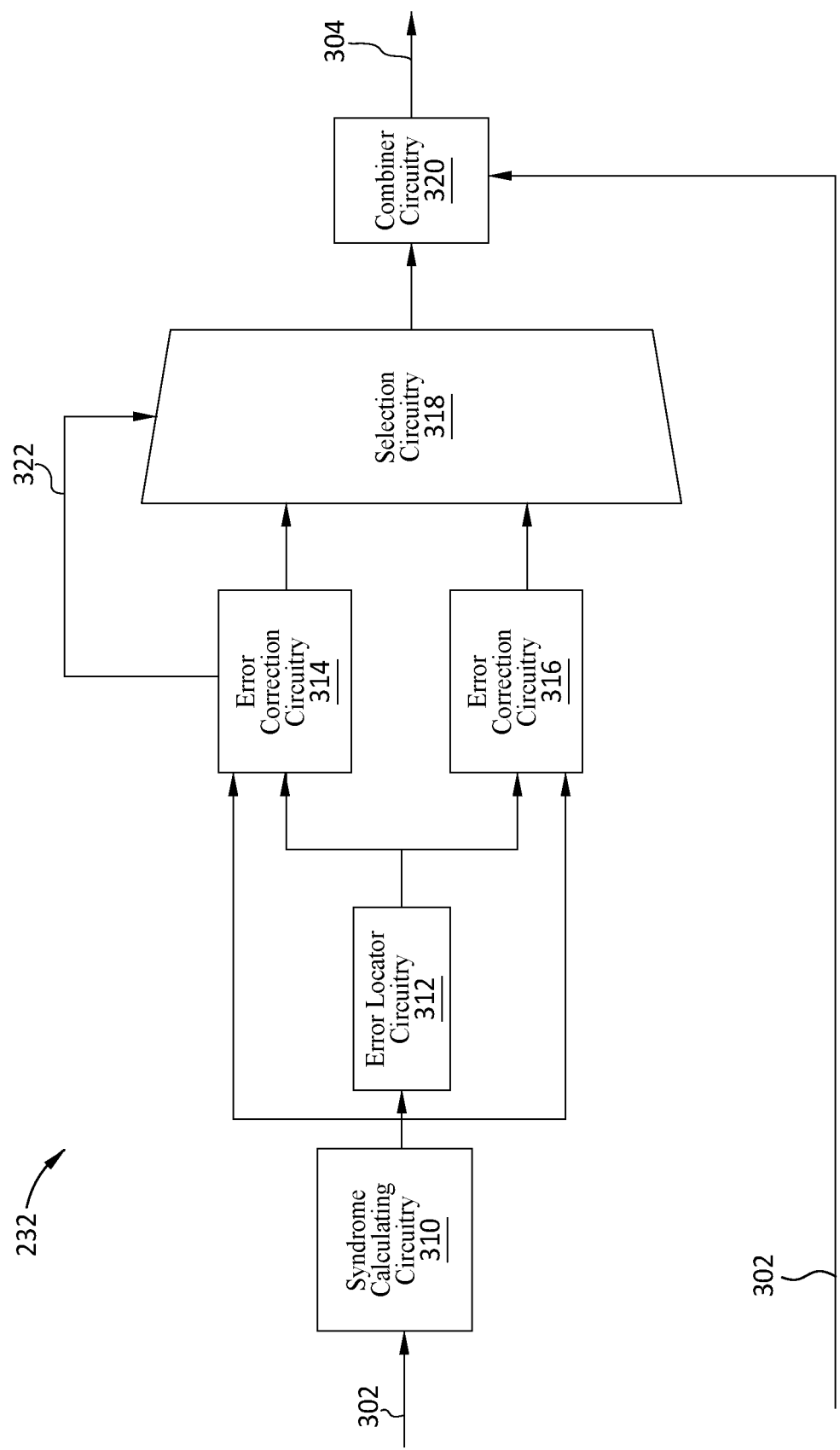
FIG. 3 illustrates a block schematic diagram of a decoder, according to one or more embodiments.

FIG. 3 is a schematic block diagram of the decoder 232, according to one or more examples. The decoder 232 includes syndrome calculating circuitry 310, error locator circuitry 312, error correction circuitry 314, error correction circuitry 316, selection circuitry 318 (e.g., multiplexer), and combiner circuitry 320.

The syndrome calculating circuitry 310 receives data from the memory device, e.g., the memory device 220. In one example, the syndrome calculating circuitry 310 receives the data from the controller 234. The syndrome calculating circuitry 310 receives data 302 (e.g., a code word) from the controller 234, processes the data 302 and provides syndrome values to the error locator circuitry 312, the error correction circuitry 314, and the error correction circuitry 316.

The syndrome calculating circuitry 310 includes multiplier circuitry, adder circuitry, and/or subtraction circuitry, among others, to process the data 302 received from the controller 234. In another example, the syndrome calculating circuitry 310 may be replaced with a syndrome calculating block that includes instructions (e.g., the instructions 726 of FIG. 7) stored in a memory device (e.g., the main memory 704 of FIG. 7) and executed by a processor (e.g., the processing device 702 of FIG. 7). Further, the syndrome calculating block may include a combination of instructions to be executed by a processing device and circuitry.

In one example, the decoder 232 uses an FEC scheme that employs an RS coding scheme. Further, in the example of FIG. 3, 256-bits of data is used (e.g., communicated between the host device 130, and the IC die 210). In other examples, the number of bits communicated by the host device 130 to the IC die 210 may be more than or less than 256 bits. Further, in the example of FIG. 2, 32-bits of parity data is received by the decoder 232 from the memory device 220. The number of bits of the parity data may be determined during the design of the decoder 232. In other examples, more than or less than 32-bits of parity may be used. Further, in the example of FIG. 3, the 32 bits of parity are used to correct one symbol errors (8-bits) or two symbol errors (16-bits).

Figure 4:
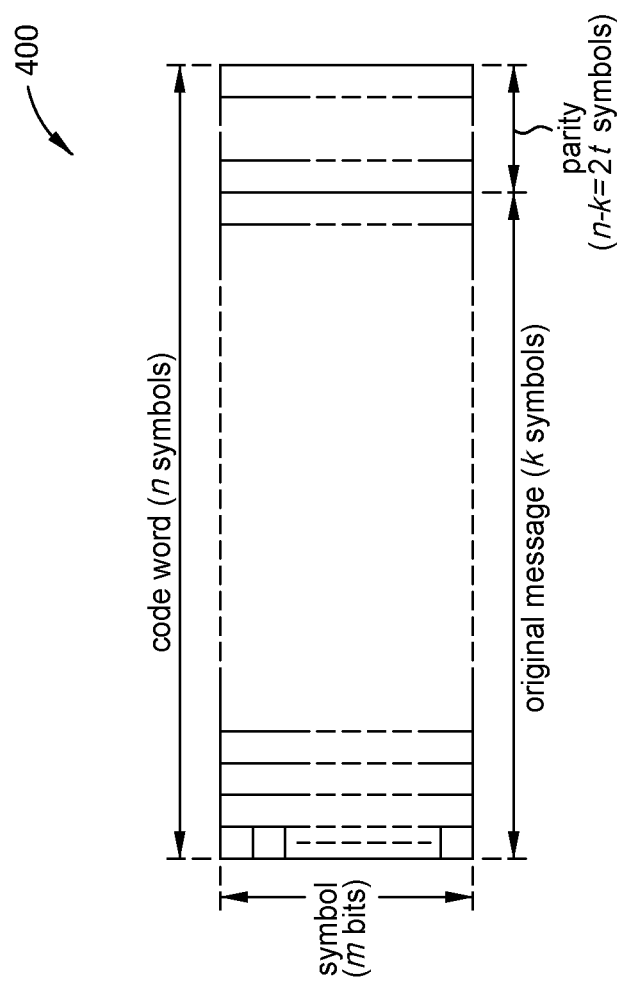
FIG. 4 illustrates a code word, according to one or more embodiments.

In a RS coding scheme, the parameter "n" defines the block symbol length (e.g., a total number of symbols a message), parameter "k" defines the message symbol length (e.g., the number of symbols in the message), and parameter "q" defines the size of each symbol in bits. The parameters n, k, and q are integers greater than zero. Further, the parameter n is greater than the parameter q. An RS code may be written as RS (n,k,q). FIG. 4 illustrates an example code word 400. The code word 400 includes n total symbols. In the n total symbols of the code word 400, there are k symbols corresponding to the original message, and (n−k) parity symbols, or t parity symbols. In one example, when the parameter n is 36 (e.g., 36 total symbols), and the parameter k is 32 (e.g., 32 symbols in the original message), the number of parity symbols is (36-32) or 4 (e.g., the parameter t is 4). The number of symbols that can be corrected is t/2, or in the above example, 2.

Each parameter of the RS coding scheme associated with the code word, or message, corresponds to an element of a Galois Field (GF). A GF corresponds to a finite field that contains a finite number of elements.

A GF is denoted as GF(m), where m is the number of elements in the field. In one example, for 8 bits per symbol, m is equal to $2^8$. Further, there are 32 symbols of the original message k and 4 symbols of parity information. The corresponding RS code can be written as RS(36,32,8). In such an example RS code, up to (36-32)/2 or 2 symbol errors occurring anywhere in the original message may be corrected.

In a GF, each element in a field can be expressed as a polynomial. Further, for a GF($2^8$), the field polynomial is defined $P(x)=x^8+x^4+x^3+x^2+1$. In another example, other field polynomials may be used. For a GF($2^8$), the generator polynomial (G(x)) is determined based on equation $G(x)=(x-a)(x-a^2) \ldots (x-a^{n-k})=g0+g^1x+ \ldots +g^{n-k-1}x^{n-k-1}+x^{n-k}$. The parameter a is the primitive element of the GF. For a GF($2^8$), a=2. Further, for a GF($2^8$) and a=2, $G(x)=64+120x+54x^2+15x^3+x^4$. Further, as is noted above, the received code word (e.g., data 302), and denoted as rx[ ], has a length of 36.

With further reference to FIG. 2, in one example, the encoder 230 is a RS(36,32) encoder that generates 4 parity symbols for every 256 bits of data. For example, an RS code word consisting of 36 symbols (256 bits of message data and 32 bits of parity data) is written to the memory device 220 via the controller 234.

Further, with further reference to FIG. 2, the decoder 232 is a RS(36,32) decoder. The decoder 232 receives the data (e.g., a code word) read back from the memory device 220 via the controller 234. The decoder 232 detects possible errors in the data and corrects errors before the data is sent to the host device 130.

The syndrome calculating circuitry 310 calculates the syndrome values. For example, the syndrome calculating circuitry 310 calculates the syndrome values (e.g., syndromes) based on the RS code of the decoder 232. Calculating the syndrome evaluates a polynomial of the data to identify one or more possible errors within the data. For an RS code of (36,32,8), four syndrome values are determined as S[0],S[1],S[2] and S[3]. Each syndrome is an 8 bit value. The syndrome calculation is given by the following, for i=(0 to 2t−1):

$$S[i]=\Sigma_{j=0}^{n-1}(rx[j]\times[\alpha^i]^j).\qquad\text{Equation 1}$$

In one example, rx[ ] refers to the received code word (e.g., data) having 36 symbols and symbol is 8-bit wide. In other example, the code word may have more than or less than 36 symbols and/or each symbol is more or less than 8-bit wide. The syndrome calculating circuitry 310 communicates the syndrome values to the error locator circuitry 312, the error correction circuitry 314, and the error correction circuitry 316.

The error locator circuitry 312 includes multiplier circuitry, adder circuitry, and/or subtraction circuitry, among others, to process the syndrome values received from the syndrome calculating circuitry 310. In another example, the error locator circuitry 312 may be replaced with an error locator block that includes instructions (e.g., the instructions 726 of FIG. 7) stored in a memory device (e.g., the main memory 704 of FIG. 7) and executed by a processor (e.g., the processing device 702 of FIG. 7). Further, the error locator block may include a combination of instructions to be executed by a processing device and circuitry.

The error locator circuitry 312 determines a location for each error within the data received from the memory device 220. The error locator circuitry 312 uses the syndrome values provided by the syndrome calculating circuitry 310 to determine an error locator equation for the errors within the data. For example, if there is a single error, the error locator circuitry 312 generates a linear equation. Further, if there is more than one error, the error locator circuitry 312 generates a polynomial. Further, if there are no errors within the data, a zero degree polynomial is generated by the error locator circuitry 312. In one example, a single error locator circuitry 312 is utilized to process the syndrome values and output a corresponding equation to the error correction circuitry 314 and the error correction circuitry 316. In another example, instead of error locator circuitry 312 being implemented for both the error correction circuitry 314 and the error correction circuitry 316, a separate error location circuitry may be implemented for each of the error correction circuitry 314 and the error correction circuitry 316.

The equation generated by the error locator circuitry 312 is in the form of $L2x^2+L1x+C$. The parameters L1, L2, and C are given by:

$$L2=(S[2]^2+S[1]S[3])/(S[0]S[2]+S[1]^2) \qquad \text{Equation 2}$$

$$L1=(S[1]S[2]+S[0]S[3])/(S[0]S[2]+S[1]^2), \text{ and} \qquad \text{Equation 3}$$

$$C=1. \qquad \text{Equation 4}$$

The error locator circuitry 312 identifies the position of the one or more errors by setting $L2x^2+L1x+C$ to 0 and multiplying $S[0]S[2]+S[1]^2$ throughout. Multiplying $S[0]S[2]+S[1]^2$ throughout $L2x^2+L1x+C$, removes the division operations from the process executed by the error locator circuitry 312. Accordingly, in view of equations 2-5, $L2x^2+L1x+C$ is represented as:

$$(S[2]2+S[1]S[3])*x^2+(S[1]S[2]+S[0]S[3])*x+(S[0]S[2]+S[1]^2)=0 \qquad \text{Equation 6.}$$

Equation 5 may also be represented as:

$$(S[2]2+S[1]S[3])*x^2+(S[1]S[2]+S[0]S[3])*x=(S[0]S[2]+S[1]^2) \qquad \text{Equation 7.}$$

The error locator circuitry 312 determines the position of each error based on equation 5, solving for each 'x' from $x=a^0$ to $x=a^{(n-1)}$. Utilizing roots solving applied to the above equation gives the error positions of p and q. The parameters $a^p$ and $a^q$ correspond to an error at position p and an error at position q. An error at position p and an error at position q are solved for each pair of error symbol positions. Further, the parameters $a^p$ and $a^q$ represent constants of the corresponding GF. The error locator circuitry 312 determines the possible location of each of the errors without determining the magnitude of each of the errors.

The error locator circuitry 312 communicates an equation (e.g., a linear equation or polynomial) to the error correction circuitry 314 and the error correction circuitry 316. Each of the error correction circuitries 314, 316 determines one or more error magnitudes and associates the error magnitudes with error positions determined from the equation. Each of the error correction circuitries 314, 316 outputs one or more error correction patterns (e.g., also referred to as corrected symbols), one or more error magnitudes, and/or one or more error positions to the selection circuitry 318. The error correction pattern output by each of the error correction circuitries 314, 316 may include corrected symbol(s) which may be used for error correction. In other words, identified errors including the error location and magnitude may be used to generate the correction pattern that may be used to correct the data received from the memory device.

In one example, the error correction circuitry 314 determines a single error magnitude and associated error position. Further, the error correction circuitry 316 determines two error magnitudes and associated error positions. The error correction circuitry 316 determines more error magnitudes and associated error positions than that of the error correction circuitry 314. In one example, the error correction circuitry 314 and the error correction circuitry 316 determine corresponding error magnitudes and associated error positions in parallel. Further, the determination of the error magnitudes occurs in parallel with the processing of the error locator circuitry 312. For example, the error correction circuitry 314 and the error correction circuitry 316 determine corresponding error magnitudes during an overlapping time period with when the error positions are determined and selected.

In an example where the number of errors is one, the error correction circuitry 314 determines an error magnitude and associated error position for the single error. Further, in an example where the number of errors is two, the error correction circuitry 316 determines a magnitude and associated error position for each of the errors. In such an example, the error correction circuitry 314 is invalid as the number of errors is greater than one and the error correction circuitry 314 is configured to determine a magnitude and associated error position for a single error.

The output of the error correction circuitry 314 and the error correction circuitry 316 is output to the selection circuitry 318. Further, the error correction circuitry 314 outputs a control signal 322 to the selection circuitry 318. In another embodiment, the control signal 322 is provided by the syndrome calculating circuitry 310, the error locator circuitry 312, the error correction circuitry 316, or an element external to the decoder 232. The selection circuitry 318 selects the output of the error correction circuitry 314 or the output of the error correction circuitry 316 based on the control signal 322.

In one example, the control signal 322 indicates that the number of errors is one. Accordingly, based on the control signal 322 indicating that the number of errors is one, the selection circuitry 318 selects the output provided by the error correction circuitry 314. In another example, the control signal 322 indicates that the number of errors is greater than one (e.g., two or more). Accordingly, based on the control signal 322 indicating that the number of errors is greater than one (e.g., two or more), the selection circuitry 318 selects the output provided by the error correction circuitry 316.

The selection circuitry 318 outputs the corrected symbol or symbols to the combiner circuitry 320. The combiner circuitry 320 receives the data 302 and combines the corrected symbol or symbols with the data 302 to generate corrected data 304. For example, the error symbol or symbols within the data 302 are replaced with the corresponding corrected symbol or symbols provided by the selection circuitry 318. In one example, the corrected data 304 is communicated to the host device 130. For example, with reference to FIG. 1, the corrected data 304 is communicated to the host device 130 via the host interface 114.

Figure 5:
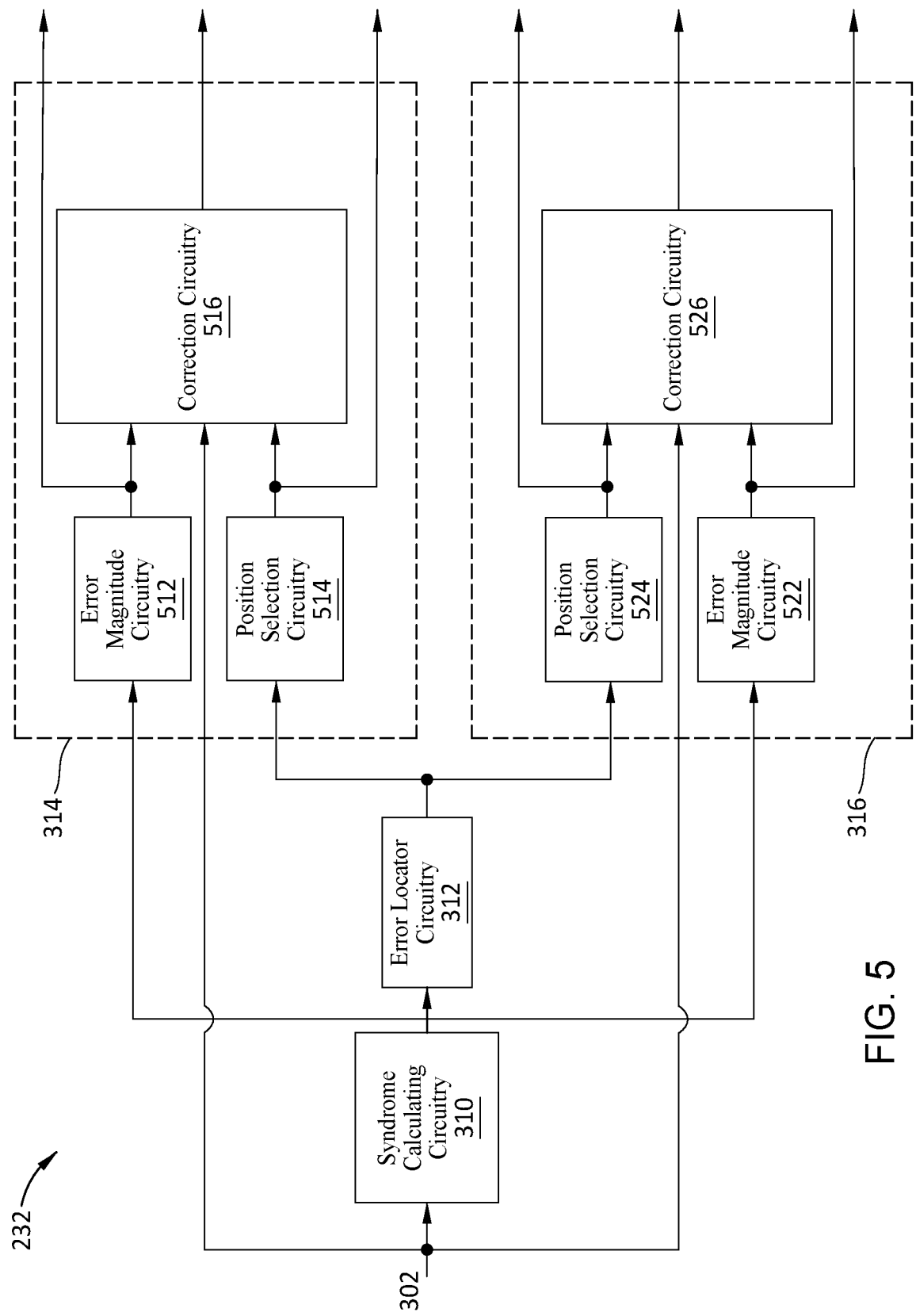
FIG. 5 illustrates a block schematic diagram of a decoder, according to one or more embodiments.

FIG. 5 is a schematic block diagram of a portion of the decoder 232, according to one or more embodiments. For example, FIG. 5 illustrates the syndrome calculating circuitry 310, the error locator circuitry 312, the error correction circuitry 314, and the error correction circuitry 316. The error correction circuitry 314 includes error magnitude circuitry 512, error position selection circuitry 514, and correction circuitry 516. Further, the error correction circuitry 316 includes error magnitude circuitry 522, error position selection circuitry 524, and correction circuitry 526.

The error magnitude circuitry 512 is connected to the syndrome calculating circuitry 310 and receives the output of the syndrome calculating circuitry 310. For example, the error magnitude circuitry 512 receives the syndrome value or values from the syndrome calculating circuitry 310.

The error magnitude circuitry 522 is connected to the syndrome calculating circuitry 310 and receives the output of the syndrome calculating circuitry 310. For example, the error magnitude circuitry 522 receives the syndrome value or values from the syndrome calculating circuitry 310.

The error magnitude circuitry 512 and the error magnitude circuitry 522 determine the magnitude of the error or errors within the data 302 from the syndrome values provided by the syndrome calculating circuitry 310. Each of the error magnitude circuitry 512 and the error magnitude circuitry 522 determines the magnitude of each error without (e.g., independent from) determining the location of each error. The error magnitude circuitry 512 determines the magnitude of error for any one position within the data 302 and the error magnitude circuitry 522 determines the magnitude of error for any two positions within the data 302.

In one example, the error magnitude circuitry 512 uses the following equations to determine the possible error magnitude for the error.

$$e1=S[0], \text{ and} \quad \text{Equation 7}$$

$$e1*a^P=S[1]. \quad \text{Equation 8}$$

The error magnitude circuitry 512 determines, for single error scenarios, the error magnitude based on $S[1]/S[0]$ or $S[1]*S[0]^{-1}$. However, to avoid the division operation (or inverse multiplication) a look-up table (LUT) having an entry for the inverse of each position may be utilized. When determining the error magnitude, the position is utilized as an index value for the LUT to obtain a corresponding value.

The error magnitude circuitry 522 utilizes equations 9 and 10 to determine the possible error magnitudes for each two symbol positions within the data. For example, if e1 and e2 are the errors at any two symbol positions in the code word, then:

$$e1+e2=S[0], \text{ and} \quad \text{Equation 9}$$

$$e1*a^P+e2*a^q=S[1]. \quad \text{Equation 10}$$

where 'p' and 'q' are two error positions in the data 302 such that $0<=(p, q)<=(n-1)$. Equations 11 and 12 are used to solve for e1 and e2:

$$e1[p][q]=(S[0]*a^q+S[1])/(a^P+a^q), \text{ and} \quad \text{Equation 11}$$

$$e2[p][q]=(S[0]*a^P+S[1])/(a^P+a^q). \quad \text{Equation 12}$$

Each of the equations 11 and 12 include a division operation. However, to avoid performing a division operation, a look-up-table (LUT) storing constant values of $1/(a^P+a^q)$ is used by the decoder 232. The constant values of the LUT are generated for each symbol position within the data. In one example, the error magnitude circuitry 522 accesses a LUT using the pair of positions as an index to identify a corresponding value. The value is provided by the LUT to the error magnitude circuitry 522 and multiplied with (S[0] *$a^q$+S[1]) and (S[0]*$a^P$+S[1]) to determine the magnitude values e1 and e2. In one example, for RS(36,32) (e.g., an RS coding scheme utilizing 36 symbols), a LUT having 36×36 or 1296 entries is used. Using the values within the LUT, the equations 10 and 11 can be written as equation 11 and 12, respectively. In equations 13 and 14, LUT(a,p,q) is an index based on the pair of symbol positions within the data.

$$e1[p][q]=(S[0]*a^q+S[1])*\text{LUT}(a,p,q), \text{ and} \quad \text{Equation 13}$$

$$e2[p][q]=(S[0]*a^P+S[1])*\text{LUT}(a,p,q). \quad \text{Equation 14}$$

As compared to equations 10 and 11, the equations 14 and 15 involve an addition operation (or an XOR operation) and a multiplication operation by constant values and do not include a division operation.

The error position selection circuitry 514 and the error position selection circuitry 524 selects the position of the errors within the data. For example, the error position selection circuitry 514 generates the position of the error within the data based on the equation generated by the error locator circuitry 312. For example, the error position selection circuitry 514 selects the location of the symbols having errors within the data based on the output provided by the error locator circuitry 312.

In one example, the output of the error magnitude circuitry 512, the output of the error position selection circuitry 514, and the data 302 is provided to the correction circuitry 516. The correction circuitry 516 associates an error magnitudes with the error location to determine an error correction pattern (e.g., corrected symbols) based on the error magnitude provided by the error magnitude circuitry 512, the position of the error provided by the error position selection circuitry 514, and the data 302. For example, the correction circuitry 516 generates an error correction pattern based on the error magnitude, the error position, and the data 302. The error correction pattern is generated by determining the error position within the code word and inserting (e.g., associating) the corresponding error magnitude with the error position. Based on the error position and corresponding error magnitude, a corresponding error correction pattern is created. The correction pattern is output to the selection circuitry 318.

In another example, the output of the error magnitude circuitry 522, the output of the error position selection circuitry 524, and the data 302 is provided to the correction circuitry 526. The correction circuitry 526 associates error magnitudes with error positions to determine an error correction pattern (e.g., corrected symbols) based on the error magnitudes provided by the error magnitude circuitry 522, the positions of the error provided by the error position selection circuitry 524, and the data 302. For example, the correction circuitry 526 generates an error correction pattern based on the error magnitudes, the error positions, and the data 302. The error correction pattern is generated by determining a first error position within the data 302 (e.g., a code word) and inserting (e.g., associating) the corresponding error magnitude with the first error position and a second error position within the code word and inserting (e.g., associating) the corresponding error magnitude with the second error position. Based on the first and second error positions and corresponding error magnitudes, a corresponding error correction pattern is created. The error correction pattern is output to the selection circuitry 318.

As is noted above, with further reference to FIG. 3, the selection circuitry 318 selects the error correction pattern output by the error correction circuitry 314 or the error correction circuitry 316 based on the control signal 322. In one example, the control signal 322 is indicative of a single symbol error and the selection circuitry 318 selects the error correction pattern output by the error correction circuitry 314. Further, in another example, the control signal 322 is indicative of two symbol errors and the selection circuitry 318 selects the error correction pattern output by the error correction circuitry 316.

The output of the selection circuitry 318 is connected to the combiner circuitry 320. The combiner circuitry 320 receives the selected error correction pattern from the error correction circuitry 314 and the data 302 to generate the corrected data 304. The combiner circuitry 320 corrects the data 302 by positioning the error values at the identified error positions in the data 302. For example, the combiner circuitry 320 include XOR logic that XORs the selected error correction pattern with the symbols of the data 302. In one example, a two-stage MUX for each symbol position is used to correct the data 302.

The error magnitude circuitry 512, the error position selection circuitry 514, the correction circuitry 516, the error magnitude circuitry 522, the error position selection circuitry 524, and/or the correction circuitry 526 include corresponding multiplier circuitry, adder circuitry, and/or subtraction circuitry, among others. In another example, the error magnitude circuitry 512 and/or the error magnitude circuitry 522 may be replaced with a respective error magnitude block that includes instructions (e.g., the instructions 726 of FIG. 7) stored in a memory device (e.g., the main memory 704 of FIG. 7) and executed by a processor (e.g., the processing device 702 of FIG. 7). Further, the error magnitude block may include a combination of instructions to be executed by a processing device and circuitry. Additionally, or alternatively, the error position selection circuitry 514 and/or the error position selection circuitry 524 may be replaced with a respective error position selection block that includes instructions (e.g., the instructions 726 of FIG. 7) stored in a memory device (e.g., the main memory 704 of FIG. 7) and executed by a processor (e.g., the processing device 702 of FIG. 7). Further, the error position selection block may include a combination of instructions to be executed by a processing device and circuitry. Additionally, or alternatively, the correction circuitry 516 and/or the correction circuitry 526 may be replaced with a correction block that includes instructions (e.g., the instructions 726 of FIG. 7) stored in a memory device (e.g., the main memory 704 of FIG. 7) and executed by a processor (e.g., the processing device 702 of FIG. 7). Further, correction block may include a combination of instructions to be executed by a processing device and circuitry.

Figure 6:
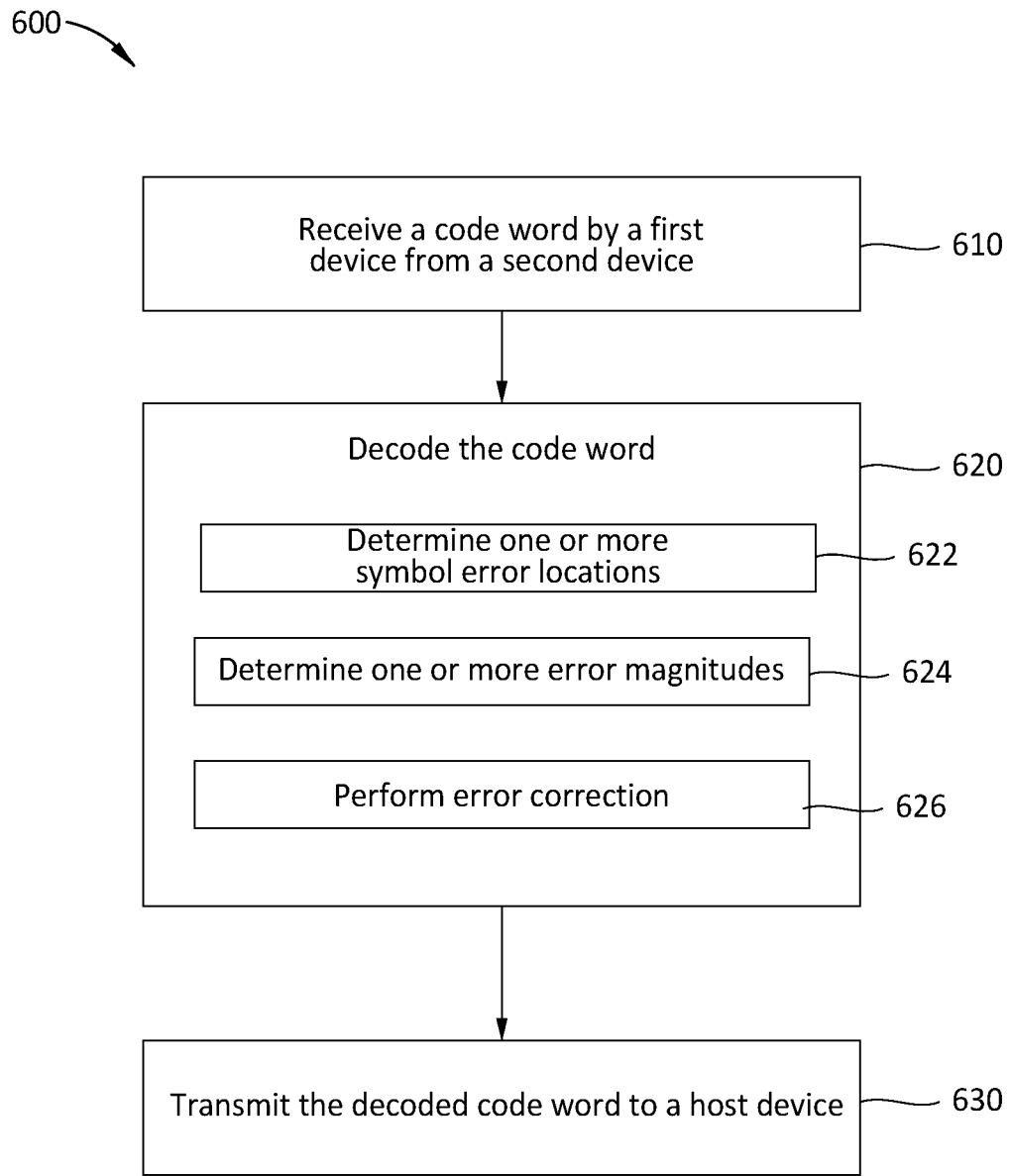
FIG. 6 illustrates a flow chart of a method for decoding data, according to one or more embodiments.

FIG. 6 illustrates a flow chart of a method 600 for correcting errors within a code word (e.g., data). In one example, with reference to FIG. 7, the processing device 702 performs the method 600 using instructions 726 stored in the main memory 704 or the machine-readable storage medium 724.

At 610 of method 600, a code word (e.g., data) is received by a first device from a second device. For example, with reference to FIG. 1, the device 110 receives (e.g., acquires) a code word from the device 120. With reference to FIG. 3, the communication interface 212 of the IC die 210 receives a code word from the memory device 220. At 620, the code word is decoded. For example, the decoder 232 decodes the code word. Decoding the code word includes, at 622, determining one or more symbol error locations within the code word. For example, as is described above and with reference to FIG. 3, the decoder 232 determines one or more error locations within the code word. In one example, with reference to FIG. 5, the syndrome calculating circuitry 310, the error locator circuitry 312, and the error position selection circuitry 514 and/or the error position selection circuitry 524 determine the one or more symbol error locations within the code word. Further, decoding the code word includes, at 624 of the method 600, determining one or more error magnitudes within the code word. For example, with reference to FIG. 3, the decoder 232 determines one or more error magnitudes within the code word. In another example, with regard to FIG. 5, the syndrome calculating circuitry 310 and the error magnitude circuitry 512 and/or the error magnitude circuitry 522 determine the one or more error magnitudes within the code word. The one or more symbol error locations and the one or more symbol error magnitudes are determined in parallel to each other and independently from each other. For example, the one or more symbol error locations and the one or more symbol error magnitudes are determined during at least partially overlapping periods with each other. In one example, the one or more symbol error locations are determined during a first period and the one or more symbol error magnitudes are determined during a second period. In such an example, the first period and the second period start at the same time and/or end at the same time. Further, the length of the first period may be same or different from the length of the second period.

As compared to a decoding method that utilizes a Berlekamp-Massey algorithm that utilizes an iterative algorithm, or similar iterative algorithm, to determine the error location and error magnitude, the decoder 232 determines the one or more symbol error magnitudes and positions of the errors in parallel to each other and independently from each other. Accordingly, the latency of the decoder 232 is decreased as compared to decoders that utilize other decoding techniques.

Decoding the code word further includes 626 of the method 600, performing error correction. Performing error correction includes associating error locations with error magnitudes. For example, with reference to FIG. 2, the decoder 232 performing error correction includes associating the one or more error locations with the one or more error magnitudes. In one example, with reference to FIG. 5, the correction circuitry 516 and/or the correction circuitry 526 associates the one or more error locations within the one or more error magnitudes. Further, performing error correction includes generating one or more error correction patterns. The error correction patterns are generated from the associated error locations and error magnitudes. For example, with reference to FIG. 2, the decoder 232 generates one or more error correction patterns from the associated error locations and error magnitudes and corrects the code word based on one or more error correction patterns. In one example, with reference to FIG. 3, one or more of the error correction circuitry 314 and the error correction circuitry 316 generates an error correction pattern from an associated one or more error locations and one or more error magnitudes. Further, with reference to FIG. 3, the selection circuitry 318 selects a corresponding correction pattern based on a number of identified errors within the code word. Further, the combiner circuitry 320 combines the correction pattern with the data 302 to generate corrected data 304. In one example, if no errors are detected within the code word, correction of the code word is skipped. For example, if no errors are detected within the code word, one or more of 622, 624, and 626 of the method 600 may be skipped.

At 630 of the method 600, the decoded data is transmitted to a host device. For example, with reference to FIG. 2, the decoded data decoded by the decoder 232 is communicated to the host device 130. In one example, the decoded data is communicated to an application running on the host device 130.

Figure 7:
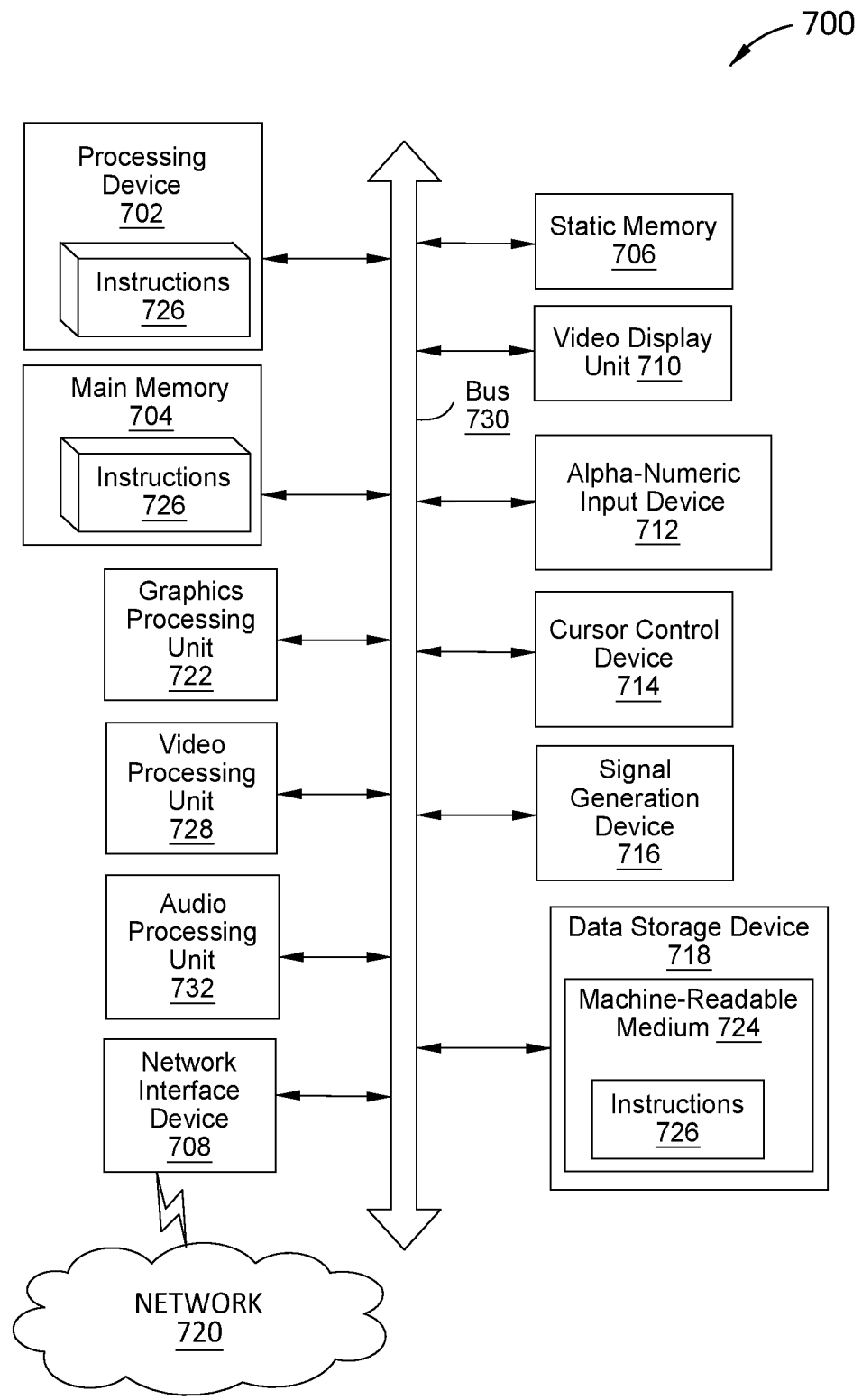
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein (e.g., encoding and/or decoding data), may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for error correction, comprising:
    receiving data at a first device;
        decoding, by decoder circuitry of the first device, the data, wherein the decoding comprises:
        determining a first error location within the data;
        determining a first error magnitude within the data based on a syndrome value determined from the data, wherein determining the first error magnitude is in parallel with determining the first error location; and
        performing error correction to generate the decoded data based on the first error location and the first error magnitude; and
        transmitting the decoded data to a second device.

2. The method of claim 1, wherein decoding the data further comprises associating the first error location with the first error magnitude, and wherein the error correction is performed based on the association between the first error location and the first error magnitude.

3. The method of claim 1, wherein performing the error correction comprises generating an error correction pattern based on the first error location and the first error magnitude.

4. The method of claim 3, further comprising selecting the generated error correction pattern based on a control signal indicating that a number of errors associated with the data is one.

5. The method of claim 1, wherein:
    decoding the data further comprises:
    determining a second error location within the data;
    determining a second error magnitude within the data in parallel with determining the second error location; and
    performing the error correction comprises generating an error correction pattern based on the first and second error magnitudes and the first and second error locations.

6. The method of claim 5, further comprising selecting the generated error correction pattern based on a control signal indicating that a number of errors associated with the data is greater than one.

7. The method of claim 1, wherein decoding the data further comprises determining an error magnitude for each symbol position within the data.

8. The method of claim 1, wherein the decoder circuitry comprises a reed-solomon decoder.

9. The method of claim 1, wherein the second device comprises a memory device.

10. A communication interface system of a first device, the communication interface system comprising:
    decoder circuitry configured to:
        receive data;
        generate decoded data from the data by:
            determining a first error location within the data during a first period;
            determining a first error magnitude within the data during a second period based on a syndrome value determined from the data, wherein the second period at least partially overlaps with the first period; and
            performing error correction to generate the decoded data based on the first error location and the first error magnitude; and
        transmit the decoded data to a host device.

11. The communication interface system of claim 10, wherein generating the decoded data further comprises associating the first error location with the first error magnitude, and wherein performing the error correction comprises generating an error correction pattern based on the association of the first error location and the first error magnitude.

12. The communication interface system of claim 11, wherein the decoder circuitry is further configured to select the generated error correction pattern based on a control signal indicating that a number of errors associated with the data is one.

13. The communication interface system of claim 10, wherein:
    generating the decoded data further comprises:
    determining a second error location within the data; and
    determining a second error magnitude within the data in parallel with determining the second error location; and
    performing the error correction comprises generating an error correction pattern based on the first and second error magnitudes and the first and second error locations.

14. The communication interface system of claim 13, wherein the decoder circuitry is further configured to select the generated error correction pattern based on a control signal indicating that a number of errors associated is greater than one.

15. A system comprising:
    a first device configured to:
        receive data;
        generate decoded data from the data by:
            determining a first error location within the data;
            determining a first error magnitude within the data based on a syndrome value determined from the data, wherein determining the first error magnitude is in parallel with determining the first error location; and
            performing error correction to generate the decoded data based on the first error location and the first error magnitude; and
        transmit the decoded data to a second device via an interface.

16. The system of claim 15, wherein generating the decoded data further comprises associating the first error location with the first error magnitude, and wherein performing the error correction comprises generating an error correction pattern based on the association between the first error location and the first error magnitude.

17. The system of claim 16, wherein generating the decoded data further comprises selecting the generated error correction pattern based on a control signal indicating that a number of errors associated with the data is one.

18. The system of claim 15, wherein generating the decoded data further comprises:
    determining a second error location within the data; and
    determining a second error magnitude within the data in parallel with determining the second error location; and
    performing the error correction comprises generating an error correction pattern based on the first and second error magnitudes and the first and second error locations.

19. The system of claim 18, wherein generating the decoded data further comprises selecting the generated error correction pattern based on a control signal indicating that a number of errors associated with the data is greater than one.

20. The system of claim 15 further comprises a memory device, and wherein the first device is configured to receive the data from the memory device.

* * * * *